（12）United States Patent
Okano

(10) Patent No.: US 7,923,919 B2
(45) Date of Patent: Apr. 12, 2011

(54) ORGANIC ELECTROLUMINESCENT PANEL AND PRODUCTION METHOD THEREOF, AND COLOR FILTER SUBSTRATE AND PRODUCTION METHOD THEREOF

(75) Inventor: Kiyoshi Okano, Suzuka (JP)

(73) Assignee: Sharp Kabushiki Kaisha, Osaka (JP)

( * ) Notice: Subject to any disclaimer, the term of this patent is extended or adjusted under 35 U.S.C. 154(b) by 433 days.

(21) Appl. No.: 11/577,407

(22) PCT Filed: Oct. 20, 2005

(86) PCT No.: PCT/JP2005/019334
§ 371 (c)(1),
(2), (4) Date: Apr. 17, 2007

(87) PCT Pub. No.: WO2006/054421
PCT Pub. Date: May 26, 2006

(65) Prior Publication Data
US 2008/0036374 A1 Feb. 14, 2008

(30) Foreign Application Priority Data
Oct. 28, 2004 (JP) ................................ 2004-314546

(51) Int. Cl.
*H01J 1/62* (2006.01)
*H01J 63/04* (2006.01)

(52) U.S. Cl. ........ 313/504; 313/500; 313/506; 313/509; 445/24; 349/104; 349/105; 349/106; 349/107; 349/108; 349/109

(58) Field of Classification Search .................. 313/504, 313/506, 500, 509; 445/24; 349/104–109
See application file for complete search history.

(56) References Cited

U.S. PATENT DOCUMENTS
6,339,288 B1    1/2002 Qian et al.
6,559,604 B2 *  5/2003 Lu et al. ............. 315/169.3
(Continued)

FOREIGN PATENT DOCUMENTS
JP    2000-150140 A  *  5/2000
(Continued)

OTHER PUBLICATIONS
Official communication issued in the corresponding International Application No. PCT/JP2005/019334, mailed on Mar. 20, 2006.

*Primary Examiner* — Nimeshkumar D Patel
*Assistant Examiner* — Thomas A Hollweg
(74) *Attorney, Agent, or Firm* — Keating & Bennett, LLP

(57) ABSTRACT

The present invention provides an organic electroluminescent panel, a production method thereof, and an organic electroluminescent display device, in which color mixing between adjacent pixels, caused by overflow or pull-in of a liquid material is suppressed and discontinuity (physical and electrical separation by the step) of an upper electrode is reduced when an organic film such as a luminescent layer is formed by an application method such as an ink jet printing method. The organic electroluminescent panel of the present invention is an organic electroluminescent panel comprising a lower electrode, a bank, an organic film, and an upper electrode on a substrate, wherein the organic electroluminescent panel has: two or more bank regions having different film thicknesses; and an organic film region surrounded by the two or more bank regions, the organic film region having a planar shape of a quadrangle or a substantial quadrangle with a rounded vertex or side.

30 Claims, 6 Drawing Sheets

U.S. PATENT DOCUMENTS

| | | |
|---|---|---|
| 6,762,552 B1 | 7/2004 | Duineveld et al. |
| 6,921,148 B2 | 7/2005 | Nakamura et al. |
| 6,948,993 B2 * | 9/2005 | Yi et al. ............ 445/24 |
| 7,102,280 B1 | 9/2006 | Duineveld et al. |
| 2003/0052596 A1 * | 3/2003 | Yi et al. ............ 313/504 |
| 2003/0076572 A1 * | 4/2003 | Kawase ............ 359/245 |
| 2003/0184613 A1 | 10/2003 | Nakamura et al. |
| 2004/0021413 A1 | 2/2004 | Ito et al. |
| 2004/0135501 A1 * | 7/2004 | Nishikawa |
| 2005/0040754 A1 * | 2/2005 | Sakurai |
| 2005/0058785 A1 * | 3/2005 | Uhlig et al. |
| 2005/0231564 A1 * | 10/2005 | Nakamura et al. |

FOREIGN PATENT DOCUMENTS

| | | | |
|---|---|---|---|
| JP | 2003-100466 A | * | 4/2003 |
| JP | 2003-515909 A | | 5/2003 |
| JP | 2003-229247 A | * | 8/2003 |
| JP | 2004-071432 A | * | 3/2004 |
| JP | 2004-165067 A | | 6/2004 |
| JP | 2004-230660 A | * | 8/2004 |
| JP | 2005-070295 A | * | 3/2005 |
| JP | 2005-100982 A | * | 4/2005 |
| JP | 2005-310713 A | * | 11/2005 |
| JP | 2005-322564 A | * | 11/2005 |

* cited by examiner (a)

(b)

(c)

(d)

(a)

(b)

(c)

(d)

ORGANIC ELECTROLUMINESCENT PANEL AND PRODUCTION METHOD THEREOF, AND COLOR FILTER SUBSTRATE AND PRODUCTION METHOD THEREOF

BACKGROUND OF THE INVENTION

1. Field of the Invention

The present invention relates to organic electroluminescent panels and production methods thereof, and color filter substrates and production methods thereof. More specifically, the present invention relates to an organic electroluminescent panel preferable for large and full-color panels, a production method thereof, an organic electroluminescent display device, a color filter substrate, a production method thereof, a liquid crystal display panel, and a liquid crystal display device.

2. Description of the Related Art

Organic electroluminescent (hereinafter, also referred to as "EL") displays have been drawing attention as a next generation flat panel display (FPD) because such displays are excellent in visibility such as contrast and viewing angle and responsivity and permits low power consumption, slim profile, light weight, and flexibilization of the displays themselves. Such organic electroluminescent displays are still inferior to liquid crystal displays (LCD) or plasma display panels (PDP) in technical completeness or standard of industrial infrastructure. Therefore, practical use of the organic EL displays is still only loading on car audios or some mobile information devices. However, the organic EL displays are theoretically the most excellent FPDs and therefore, future market expansion is expected for the displays.

Such organic EL displays display images by driving an organic EL panel having a configuration in which a light-emitting organic EL element is disposed in every pixel. The organic EL element has a structure in which an organic layer including a luminescent layer is interposed between a pair of electrodes at least one of which has transparency. Small molecular organic (EL) materials have been used in the organic layer of the organic EL element because luminescent principle in small molecular organic materials was first found. A production process flow of a passive matrix (PM) driving organic EL panel using a small molecular organic material was disclosed (for example, referring to E Express ed., "E de miru yuki EL display no seizo process 03", E Express Inc., 2003, CD-ROM (Nonpatent Document 1)). A vapor deposition method of subliming a material in a vacuum and depositing the material on a substrate, thereby forming a film, is generally used for film-formation of the small molecular organic materials.

FIG. 6 is a planar view schematically showing a structure of a currently used PM driving type organic EL display device before formation of an organic layer. FIG. 7 is a cross-sectional view schematically showing the organic EL display device taken along line d-d' in FIG. 6. R, G, and B in FIG. 6 represent a red pixel, a green pixel, and a blue pixel, respectively.

In the organic EL display device shown in FIG. 6, as shown in FIG. 7, a linear insulator made of two different insulating films, that is, an edge cover (insulating layer) 51 and a cathode separator 52, are formed on a lower electrode (anode) 50, and fine patterning of a cathode, or coating separation of an organic thin film at the time of deposition can be permitted. A configuration of an organic EL element in which a half tone pattern serving as the edge cover and an insulating layer serving as the cathode separator are formed in one layer for simplification of production steps and the like was disclosed (for example, referring to Japanese Kokai Publication No. 2003-100466 (pages 2, 12, and 14, FIG. 3)(Patent Document 1)).

Growth in size of panels has been recently needed also for the organic EL display devices as well as for various FPDs. Problems associated with the growth in size include (I) a driving system of the pixel and (II) a film forming method of the organic layer.

As for (I), increase in the number of pixels associated with the growth in size delays a response speed or causes crosstalk by signal interference between the pixels in the PM driving type. On the other hand, the active matrix (AM) driving type that drives each pixel independently does not cause the above-mentioned defects, and therefore, the AM driving type is preferable as a system of driving pixels in a large panel. However, the AM driving type has more portions where the upper electrode and the bank are stacked, in comparison to the PM driving type in which the upper electrode is formed in a stripe pattern over the entire surface as an electrode that is common for all of the pixels. Therefore, discontinuity (physical and electrical separation caused by the step) of the upper electrode tends to occur at the boundary between the bank and the lower electrode. In this respect, there was room for contrivance.

As for (II), a vapor deposition technique is generally used in formation process of an organic layer in organic EL panels using small molecular organic materials. Therefore, film unevenness is likely to be generated in a large area panel, and production costs are high. Therefore, no technical prospect of production process for large panels has yet emerged. Due to the above circumstances, polymer organic (EL) materials have been noted as a material for organic layers. The polymer organic materials can be dissolved in a solution (solvent) and therefore formed as a film by wet processes such as a cast method, a spin coat method, and an ink jet printing method. The ink jet printing method is particularly preferable as an organic layer film-forming method in a large panel because the film thickness unevenness in a large panel can be reduced and higher definition of display by coating separation at the time of application, reduction in materials, and improvement in yield can be attained. However, if the ink jet printing method is used, overflow and pull-in of the ink may cause color mixing between pixels. In such a respect, there was room for contrivance. Neither the above-mentioned Non-patent Document 1 nor Patent Document 1 studied the above-mentioned (I) and (II).

FIG. 8 is a planar view schematically showing a configuration of a conventional active matrix (AM) driving full-color organic EL panel. R, G, and B in FIG. 8 represent a red pixel, a green pixel, and a blue pixel, respectively.

In the organic EL panel shown in FIG. 8, a bank 62 is formed to have a height t1 enough to prevent discontinuity of an upper electrode (not shown). However, the bank 62 having a height (thickness) of t1 has a low capability of keeping the ink inside the bank, and for example, the ink applied in the pixel region of G (green) flows into adjacent pixel regions of R (red) and B (blue), and thereby a color mixing defect is more likely to be generated. This can be prevented by reducing the ink amount applied (pooled) per ejection. However, in order to obtain a film thickness needed for obtaining desire luminescent characteristics (luminescent efficiency, lifetime), the number of times the combination of application and drying is repeated needs to be increased, which increases the number of steps of forming the organic layer. In such a respect, there was room for improvement. On the other hand, if a bank 62 having a height of t2 enough to keep the ink is formed, the capability of keeping the ink can be secured, but the discontinuity of the upper electrode is likely to occur near the boundary between the lower electrode 61 and the bank 62, and electrically-separated pixels (dots) due to the discontinuity are not lighted. In such a respect, there was room for improvement.

Also for liquid crystal displays in addition to the organic EL displays, the growth in size is needed. Therefore, even in formation of a colored layer of a color filter substrate for liquid crystal displays, application of the wet processes such as the ink jet printing method has been investigated. Therefore, even in preparation of the color filter substrate, it has been needed that color mixing between adjacent pixels, caused by overflow or pull-in of a liquid material, or discontinuity of an upper electrode is prevented.

SUMMARY OF THE INVENTION

The present invention has been made in view of the above-mentioned state of the art. The present invention has an object to provide: an organic electroluminescent panel, a production method thereof, an organic electroluminescent display device, a color filter substrate, a production method thereof, a liquid crystal display panel, and a liquid crystal display device, in which color mixing between adjacent pixels, caused by overflow or pull-in of a liquid material, is suppressed and discontinuity (physical or electrical separation by step) of an upper electrode is reduced, when an organic film such as a luminescent layer or a colored layer is formed by a coating method such as an ink jet printing method.

The present inventors made various investigations on configurations of the organic electroluminescent panel in which color mixing and discontinuity of the upper electrode can be effectively suppressed, and noted the film thickness (height) of the bank formed on the substrate and the arrangement of the bank. The inventors found that in an embodiment in which the panel has two or more bank regions having different film thicknesses and an organic film region surrounded by the two or more bank regions and having a planar shape of a quadrangle or a substantial quadrangle with a rounded vertex or side, color mixing and discontinuity of the upper electrode can be effectively suppressed. That is, the inventors found that color mixing caused by overflow or pull-in of an ink between adjacent pixels at the time of a liquid material application is suppressed mainly using a bank region having a relatively large film thickness, and that a bank region having a relatively small film thickness is formed to reduce discontinuity of an upper electrode at a portion where the upper electrode and the bank are stacked.

The above-mentioned problems can be admirably solved, leading to completion of the present invention.

That is, the present invention is an organic electroluminescent panel comprising a lower electrode, a bank, an organic film, and an upper electrode on a substrate, wherein the organic electroluminescent panel has: two or more bank regions having different film thicknesses; and an organic film region surrounded by the two or more bank regions, the organic film region having a planar shape of a quadrangle or a substantial quadrangle with a rounded vertex or side. In the present description, the term "or more" means that the value described is included. The planar shape of the organic film region means a shape viewed in the normal direction of the substrate. The configuration of the organic electroluminescent (EL) panel of the present invention is not especially limited as long as the panel essentially includes such components, and the panel may or may not include other components.

In the organic EL panel of the present invention, a voltage is applied between the lower electrode and the upper electrode through an organic film, and thereby light can be emitted. The bank is a structure (projection) partitioning a plurality of organic film regions (dot-shaped organic films) and includes two or more bank regions having different film thicknesses. The preferable embodiments of the bank include an embodiment in which the organic film region has different film thicknesses between on the length side and on the width side. According to such a present invention, the film thickness of the bank is properly adjusted for each region, and thereby mixing of liquid materials added dropwise into pixels adjacent to each other can be prevented and discontinuity (physical and electrical separation caused by the step) of the upper electrode can be reduced, when a liquid organic film material (ink) is applied by an ink jet printing method.

In the present invention, the organic film region is surrounded by the two or more bank regions having different film thicknesses. The ink droplet after added tends to have a spherical shape. Therefore, overflow of the ink can be suppressed because the bank film thickness in the width direction of the organic film region is large even if the bank film thickness in the length direction is small. As a result, inflow of the ink into adjacent pixels can be prevented.

It is preferable that if a bank region having a relatively small film thickness is defined as a first bank region and another bank region having a film thickness larger than the film thickness of the first bank region is defined as a second bank region, the first bank region forms a short-side side of an organic film region having a planar shape of a rectangle or a substantial rectangle with a rounded vertex or short-side. According to such an embodiment in which the bank having a relatively small film thickness is positioned on the short-side side of the organic film region, the functional effects of the present invention can be sufficiently exhibited. In the present invention, if the above-mentioned organic film region has a planar shape of a quadrate or a substantial quadrate with a rounded vertex, the first bank region is preferably positioned on either one of the pairs of sides. If the organic film region has a substantially quadrate planar shape in which a pair of opposite sides are rounded (for example, oval shape), the first bank region is preferably positioned on the rounded-sides.

It is preferable that the organic electroluminescent panel is driven by an active matrix driving system or a static driving system. In organic EL panels in AM driving system and the like, the upper electrode is formed as an electrode that is common to every pixel. Also in such an embodiment, the functional effects of the present invention can be sufficiently exhibited.

It is also preferable that if a bank region having a relatively small film thickness is defined as a first bank region and another bank region having a film thickness larger than the film thickness of the first bank region is defined as a second bank region, the first bank region forms a side partitioning the same colors in a pixel configuration including a plurality of colors. According to such an embodiment, the first bank region is positioned on the side partitioning the same colors, and therefore no color mixing is caused even if the ink flows into adjacent pixels across the first bank region. In such an embodiment, it is preferable that the pixel configuration is a configuration in which the plurality of colors are disposed in a stripe arrangement.

It is preferable that the bank satisfies a relationship of $t2 > t1 \times 1.5$ if a film thickness in a region having a relatively small film thickness (a first region) is defined as $t1$ and a film thickness in a region having a relatively large film thickness (a second region) is defined as $t2$. As a result, the inflow of the ink into the adjacent pixels can be effectively suppressed and simultaneously the discontinuity of the upper electrode can be effectively reduced. It is more preferable that the bank satisfies a relationship of t2>t1×3.0 for more remarkable functional effects of the present invention. The value of t1 or t2 is appropriately adjusted depending on film thickness of the organic layer, and the like. The lower limit of t1 is preferably 0.5 μm and the upper limit thereof is preferably 2.0 μm. The lower limit of t2 is preferably 1.5 μm and the upper limit thereof is preferably 10.0 μm.

It is preferable that a region having a relatively large film thickness (a second bank region) has a forward tapered cross-sectional shape. According to this embodiment, the droplet on the bank side surface is likely to slip and gather inside the bank. Therefore, the position where the ink is applied is controlled with high accuracy and the certainty of the patterning can be improved, and thereby the color mixing can be more effectively suppressed. The bank having a forward tapered shape means that the bank has a substantially trapezoidal cross-sectional shape having a wide lower side (the upper base is shorter than the lower base) when cut in the direction perpendicular to the substrate. It is more preferable that both of the bank having a relatively large film thickness (the second bank region) and the bank having a relatively small film thickness (a first bank region) have a forward tapered cross-sectional shape.

It is preferable that a region having a relatively large film thickness (a second bank region) is discontinuously formed. Thus, the bank having a relatively small film thickness (a first bank region) is formed in a priority at an intersection of the bank pattern of the region having a relatively large film thickness (the second bank region) with the bank pattern of the region having a relatively small film thickness (the first bank region). As a result, in the upper electrode, the electricity flows in a lateral direction (the direction in which R, G, and B are positioned in FIG. 1), and the resistance value of the upper electrode can be effectively reduced.

The present invention is a production method of an organic electroluminescent panel comprising a lower electrode, a bank, an organic film, and an upper electrode on a substrate, wherein banks having different film thicknesses are formed using different exposure amounts among regions when a photosensitive resin-containing material for bank formation is patterned by photolitho process. According to such a production method of an organic EL panel of the present invention, the banks having different film thicknesses can be formed by a relatively simple method of using different exposure amounts, and therefore, coating, exposure, development, and baking-process in bank-forming processes are each once performed to form the banks. Therefore, the production process of the organic EL panel having a configuration in which the banks having different film thicknesses are formed can be shortened.

The present invention is also an organic electroluminescent display device comprising the organic electroluminescent panel or an organic electroluminescent panel produced using the production method of the organic electroluminescent panel. The organic EL display device of the present invention can provide an organic electroluminescent display device with high reliability and display quality in which both color mixing caused at the time of the liquid material application and generation of the discontinuity of the upper electrode at the portion where the upper electrode and the bank are stacked are suppressed.

The present invention is also a color filter substrate comprising a bank, a colored layer, and an upper electrode on a substrate, wherein the color filter substrate has: two or more bank regions having different film thicknesses; and a colored layer region surrounded by the two or more bank regions, the colored layer region having a planar shape of a quadrangle or a substantial quadrangle with a rounded vertex or side. The color filter (CF) substrate of the present invention is the same as the organic EL panel of the present invention in that the ink jet method and the like is used to form the colored layer between the banks; and the upper electrode is formed in a layer above the colored layer or the bank, although being different in that the color filter substrate includes no lower electrode as an essential component and includes a colored layer instead of the organic film as a component. Accordingly, even in the CF substrate of the present invention, mixing of the liquid materials can be suppressed at the time of application of an ink for colored layer formation, and the discontinuity (physical and electrical separation caused by the step) of the upper electrode can be suppressed, because the colored layer region has the same configuration as that of the organic film region in the organic EL panel of the present invention.

Examples of preferable embodiments of the CF substrate of the present invention include, if a bank region having a relatively small film thickness is defined as a first bank region and another bank region having a relatively large film thickness is defined as a second bank region: an embodiment (1) in which the first bank region forms a short-side side of a colored layer region having a planar shape of a rectangle or a substantial rectangle with a rounded vertex or short-side; an embodiment (2) in which the first bank region forms a side partitioning the same colors in a pixel configuration including a plurality of colors; an embodiment (3) in which the pixel configuration is a configuration in which the plurality of colors are disposed in a stripe arrangement; an embodiment (4) in which the bank satisfies a relationship of t2>t1×1.5 if a film thickness in the first bank region is defined as t1 and a film thickness in the second bank region is defined as t2; (5) an embodiment in which the second bank region has a forward tapered cross-sectional shape; and an embodiment (6) in which the second bank region is discontinuously formed.

The present invention is a production method of a color filter substrate comprising a bank, a colored layer, and an upper electrode on a substrate, wherein banks having different film thicknesses are formed using different exposure amounts among regions when a photosensitive resin-containing material for bank formation is patterned by photolitho process. According to such a production method of a CF substrate of the present invention, banks having different film thicknesses can be formed by a relatively simple method of using different exposure amounts, and the production process of the CF substrate in a configuration in which the banks having different film thicknesses are formed can be shortened.

The present invention is also a liquid crystal display panel comprising the color filter substrate or a color filter substrate produced by the production method of the color filter substrate. It is preferable that the panel is driven by an active matrix driving system, or a static driving system.

The present invention is also a liquid crystal display device comprising the liquid crystal display panel. The liquid crystal display device of the present invention can provide excellent display quality because the color mixing in the colored layer and the discontinuity of the upper electrode can be effectively suppressed.

The organic electroluminescent panel of the present invention has two or more bank regions having different film thicknesses and an organic film region surrounded by the two or more bank regions and having a planar shape of a quadrangle or a substantial quadrangle with a rounded vertex or side.

Therefore, color mixing between adjacent pixel regions, caused by overflow or pull-in of a liquid material, can be suppressed mainly using a bank having a larger film thickness, and the discontinuity (physical and electrical separation by the step) of the upper electrode can be reduced by forming a bank having a smaller film thickness, when an organic film such as a luminescent layer is formed by an application method such as an ink jet printing method.

The color filter substrate of the present invention has two or more bank regions having different film thicknesses and a colored layer region surrounded by the two or more bank regions and having a planar shape of a quadrangle or a substantial quadrangle with a rounded vertex or side. Therefore, color mixing between adjacent pixel regions, caused by overflow or pull-in of a liquid material, can be suppressed mainly using a bank having a larger film thickness, and the discontinuity (physical and electrical separation by the step) of the upper electrode can be reduced by forming a bank having a smaller film thickness, when an organic film such as a luminescent layer is formed by an application method such as an ink jet printing method.

BRIEF DESCRIPTION OF THE DRAWINGS

FIGS. 3(a) to (d) are schematic views explaining a production flow of the organic EL display device shown in FIG. 1, by showing the structure change of the cross-section taken along line b-b' from pre-application of the ink for organic layer 20 formation to completion of the upper electrode formation by vapor deposition. FIG. 3 (b) shows the cross-section after an ink 16 for hole transporting layer formation is added dropwise; FIG. 3(c) shows the cross-section after the ink 16 is dried to form the hole transporting layer 17; FIG. 3(d) is the cross-section after the luminescent layer 18 is formed on the hole transporting layer 17 by the ink jet printing method to form the organic layer 20 and then the upper electrode 13 is formed by vapor deposition.

FIGS. 4(a) to (d) are schematic views explaining a production flow of the organic EL display device shown in FIG. 1, by showing the structure change of the cross-section taken along line c-c' from pre-application of the ink for organic layer 20 formation to completion of the upper electrode formation by vapor deposition. FIG. 4 (b) shows the cross-section after the ink 16 for hole transporting layer formation is added dropwise; FIG. 4(c) shows the cross-section after the ink 16 is dried to form the hole transporting layer 17; FIG. 4(d) is the cross-section after the luminescent layer 18 is formed on the hole transporting layer 17 by the ink jet printing method to form the organic layer 20 and then the upper electrode 13 is formed by vapor deposition.

DETAILED DESCRIPTION OF PREFERRED EMBODIMENTS

The present invention is mentioned in more detail below with reference to Embodiments using drawings, but the present invention is not limited to only these Embodiments.

Embodiment 1

Figure 1:
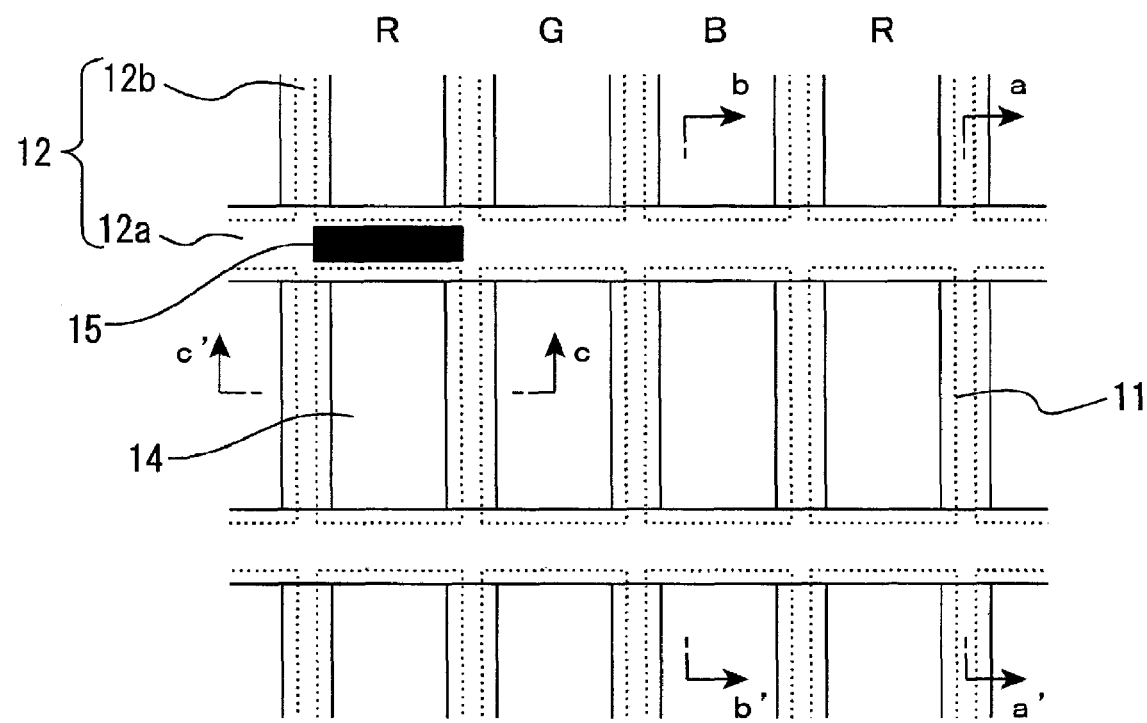
FIG. 1 is a front view schematically showing a configuration of the active matrix (AM) driving full-color organic electroluminescent (EL) display device in accordance with Embodiment 1 of the present invention.

FIG. 1 is a front view schematically showing a configuration of an active matrix (AM) driving full-color organic electroluminescent (EL) display device in accordance with Embodiment 1 of the present invention. R, G, and B in FIG. 1 represent a red pixel, a green pixel, and a blue pixel, respectively.

The organic EL display device in accordance with the present Embodiment is designed with the AM driving. A lower electrode 11 serving as a pixel electrode is arranged in an island pattern where the electrodes are partitioned into each other on a dot basis (every pixel), and an upper electrode 13 is arranged as an electrode that is common to every pixel. Transparent conductive films of ITO (indium tin oxide), IZO (indium zinc oxide), and the like are used as the lower electrode 11 in a bottom emission type in which light is emitted from the substrate side (the lower electrode side), and films of aluminum (Al), silver (Ag), platinum (Pt), nickel (Ni), or an alloy thereof are used for enhance of the reflectivity in a top emission type in which light is emitted from the upper electrode side. The formation method of these films is not especially limited, but a sputtering method is commonly used.

The bank 12 is needed for patterning an organic material-containing ink (coating liquid) into a specific shape by an inkjet printing method. Photosensitive resins such as polyimide resin, acrylic resin, and nobolac resin are commonly used as a material of the bank 12. If the photosensitive resin is used as a material of the bank, the pattern can be formed in a series of processes of resin material application, pre-baking, exposure, development, and post-baking, and therefore the production steps can be shortened. It is preferable that the surface of the bank 12 is provided with a property repelling the coating liquid (lyophobicity) and that the inside of the bank 12 (the surface of the lower electrode 11) is provided with a wetting property for the coating liquid (lyophilicity). As a result, the patterning can be accurately performed even if the droplet ejected from a nozzle drops on the bank. The lyophilicity can be provided by ultraviolet (UV)-ozone treatment or oxygen plasma treatment, and the lyophobicity can be provided by a plasma treatment using fluorine gas such as carbon tetrafluoride.

In the present Embodiment, the bank 12 includes a first bank 12a and a second bank 12 b, which have different film thicknesses, as shown in FIG. 1.

Figure 2:
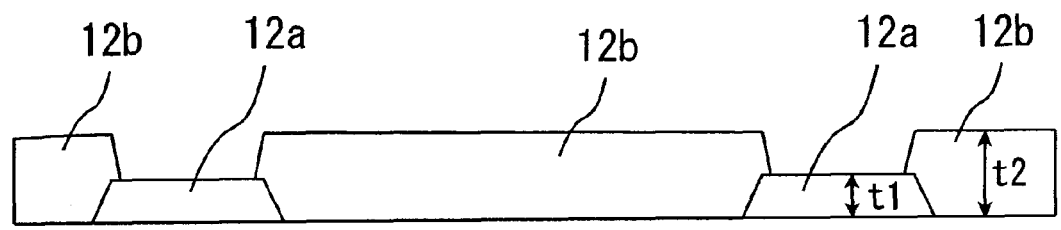
FIG. 2 is a cross-sectional view schematically showing the bank 12 taken along line a-a' in FIG. 1.

FIG. 2 is a cross-sectional view schematically showing the bank 12 taken along line a-a' in FIG. 1. If the film thickness of the first bank 12a is defined as t1 and the film thickness of the second bank 12b is defined as t2 with respect to the film thickness of the bank 12, the bank 12 is formed in such a way that the first bank 12a is thinner than the second bank 12b, for example, t1 is 1 μm and t2 is 5 μm.

The present Embodiment attains two objects simultaneously: in the region where the first bank 12a is formed, electrical connection of the upper electrode between adjacent pixels can be secured (not shown in FIGS. 1 and 2); and in the region where the second bank 12b is formed, color mixing of the inks between adjacent pixels can be suppressed. It is preferable that the film thickness value of the bank 12 is set to satisfy t2>t1×1.5. That is, it is preferable that the film thickness value is set to satisfy t2>3 μm if t1 is 2 μm. In this case, the first bank 12a having a relatively small film thickness is formed at the short-side side if the pixel has a planar shape of a rectangle or a substantial rectangle with a rounded vertex or short-side. This is because the ink droplet tends to have a spherical shape and therefore overflow of the ink droplet is hardly caused even if the film thickness in the short-side direction is smaller than that in the long-side direction.

As shown in FIG. 1, the first bank 12a is formed in the direction where the same colors are positioned if the pixels are disposed in a stripe arrangement. As a result, the discontinuity of the upper electrode can be reduced, and even if the ink flows into the adjacent pixels, a difference in dry film thickness is merely generated, and the color mixing is not caused.

Both of the first bank 12a and the second bank 12b have a forward tapered cross-sectional shape. As a result, the droplet on the bank 12 is likely to slip when applied, and therefore the patterning can be surely performed. A method of forming 12 in which a first bank 12a patterning (from application to post-baking) is performed and then a second bank 12b pattering is performed by the same process may also be applied for forming the bank 12, naturally. A method of forming bank 12 by: applying a bank member having a thickness of the second bank 12b; and patterning the bank member by exposing only the first bank 12a portion in an exposure amount smaller than that for an opening (that is, a transmission portion) in such a way that the first bank 12a has a film thickness of t1 is preferably used. As a result, processes needed for bank formation, such as application process, coating process, exposure process, development process, and baking process are each once performed to form the banks. Therefore, the production process can be shortened. This production process can be applied to the case where a positive photosensitive resin is used as the bank member.

Figure 3:
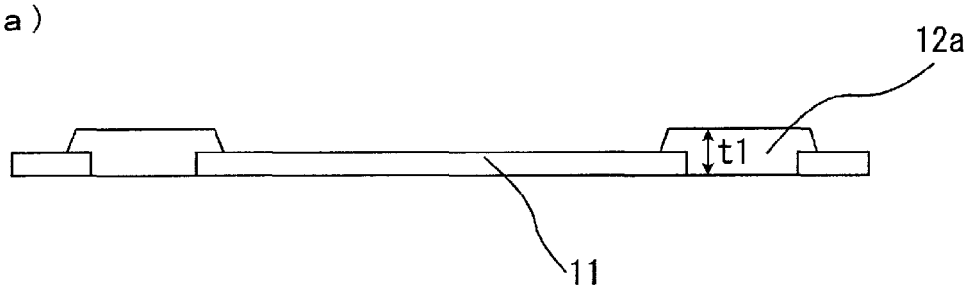
FIG. 3 (a) shows the cross-section before the ink application.
Figure 3:
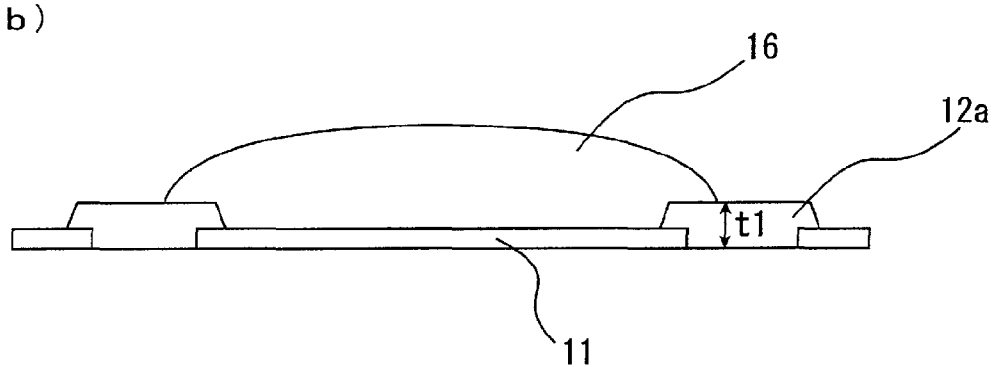
Figure 3:
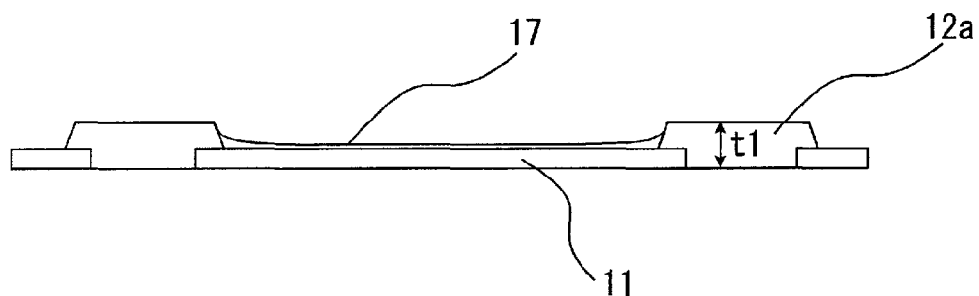
Figure 3:
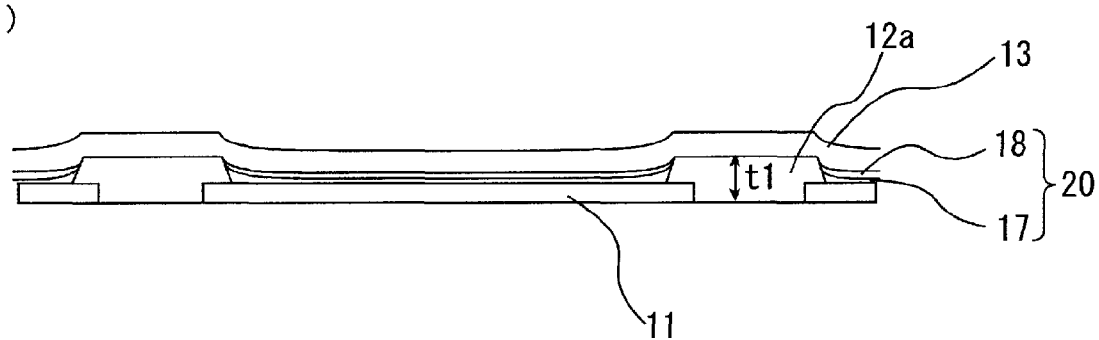

An organic layer (organic film) 20 preferably has a multi-layer structure including at least a hole transporting layer 17 and a luminescent layer 18, as shown in FIGS. 3 (d) and 4, in view of improvement in luminescence efficiency and lifetime. The present Embodiment is based on the premise that a polymer organic EL material is used as the organic layer 20. Using an ink jet printing method, an ink for forming the hole transporting layer 17 (dispersant of polyethylene dioxythiophene (PEDOT))/polyethylene sulfonic acid (PSS))and an ink for forming the luminescent layer (an aromatic hydrocarbon solution of poly(9,9-dioctyl fluorene) (PDF)) are applied and each layer is dried. As a result, a multi-layer film (each layer had a film thickness of about 100 nm) is formed. Polyaniline materials and the like may be used for the hole transporting layer 17. Poly(p-phenylene vinylene), polyspirofluorene, polyvinyl carbazole materials and the like may be used for the luminescent layer 18.

As the upper electrode 13, a reflective film of aluminum (Al), silver (Ag), and the like is used in the bottom emission type, and a transparent conductive film of ITO, IZO, and the like, is used in the top emission type. In the present invention, at least one of the lower electrode 11 and the upper electrode 13 has transparency and light is emitted from the side of the electrode with transparency.

The formation method of the upper electrode 13 is not especially limited, but a vapor deposition method or a sputtering method capable of suppressing film-formation damages is commonly used. In the top emission type, films (not shown) of metals with a low work function (alkali metals such as lithium (Li) or alkali earth metals such as calcium (Ca)), or films of fluorides or oxides thereof, are preferably inserted between the upper transmission electrode 13 and the luminescent layer 18 for improvement in electron injection efficiency.

FIGS. 3(a) to (d) are schematic views explaining a production flow of the organic EL display device shown in FIG. 1, by showing the structure change of the cross-section taken along line b-b' from pre-application of the ink for organic layer 20 formation to completion of the upper electrode formation by vapor deposition. FIG. 3 (a) shows the cross-section before the ink application; FIG. 3 (b) shows the cross-section after an ink 16 for hole transporting layer formation is added dropwise; FIG. 3(c) shows the cross-section after the ink 16 is dried to form the hole transporting layer 17; and FIG. 3(d) is the cross-section after the luminescent layer 18 is formed on the hole transporting layer 17 by the ink jet printing method to form the organic layer 20 and then the upper electrode 13 is formed by vapor deposition.

As mentioned above, the first bank 12a is thinner (lower) than the second bank 12b and the ink partly flows on the bank 12 in some cases. However, it is preferable that the planar shape of the opening 14 of the bank 12 satisfies an aspect ratio close to 1:1 (that is, close to a round or quadrate). A thin film transistor (TFT) is generally disposed in a black region 15 in FIG. 1, and therefore the first bank 12a can be wider, which makes it possible to suppress the ink from flowing into the adjacent pixels. In addition, the tapered angle of the cross-section can be smaller and therefore the conduction of the upper electrode 13 can be easily secured.

Figure 4:
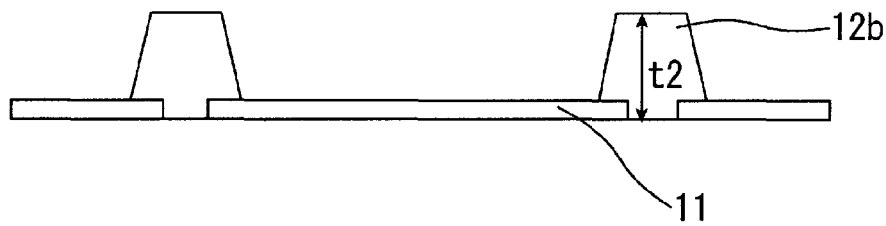
FIG. 4 (a) shows the cross-section before the ink application.
Figure 4:
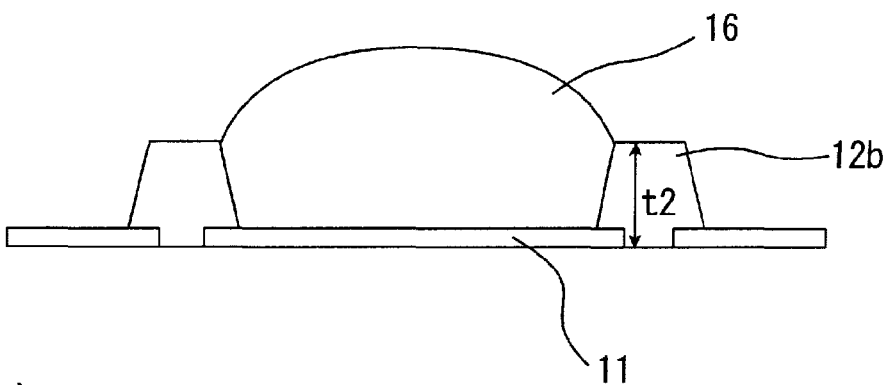
Figure 4:
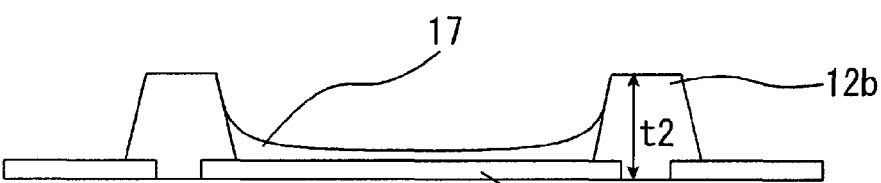
Figure 4:
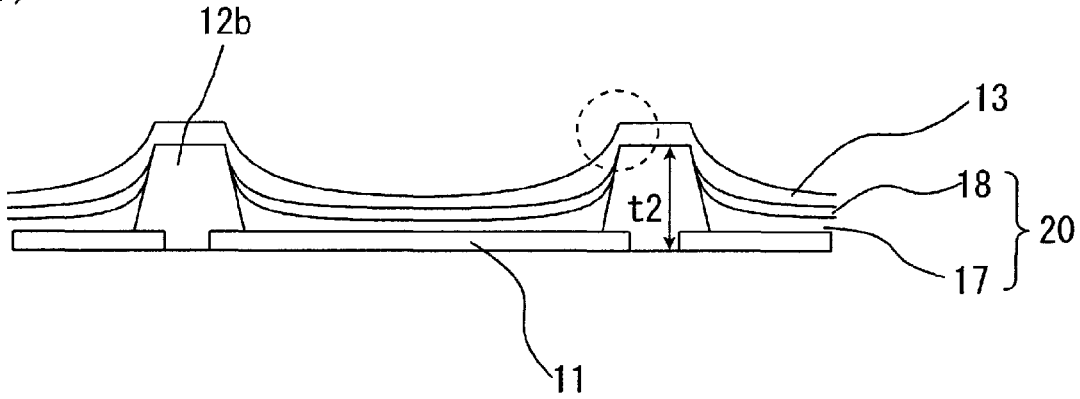

FIGS. 4(a) to (d) are schematic views explaining a production flow of the organic EL display device shown in FIG. 1, by showing the structure change of the cross-section taken along line c-c' from pre-application of the ink for organic layer 20 formation to completion of the upper electrode formation by vapor deposition. FIG. 4 (a) shows the cross-section before the ink application; FIG. 4 (b) shows the cross-section after the ink 16 for hole transporting layer formation is added dropwise; FIG. 4(c) shows the cross-section after the ink 16 is dried to form the hole transporting layer 17; and FIG. 4(d) is the cross-section after the luminescent layer 18 is formed on the hole transporting layer 17 by the ink jet printing method to form the organic layer 20 and then the upper electrode 13 is formed by vapor deposition.

In the present Embodiment, the second bank 12b has a film thickness larger than that of the first bank 12a as shown in FIG. 4(b), and therefore a phenomenon in which the ink flows on the bank 12 or the ink flows into adjacent dots can be suppressed. The discontinuity of the upper electrode 13 may occur at the portion surrounded by the circle (dotted line) shown in FIG. 4(d). However, the second bank 12b is discontinuously formed as shown in FIG. 1 and the electricity flows in the direction R, G, and B are positioned, and therefore, the resistance value of the upper electrode can be effectively reduced.

Embodiment 2

Figure 5:
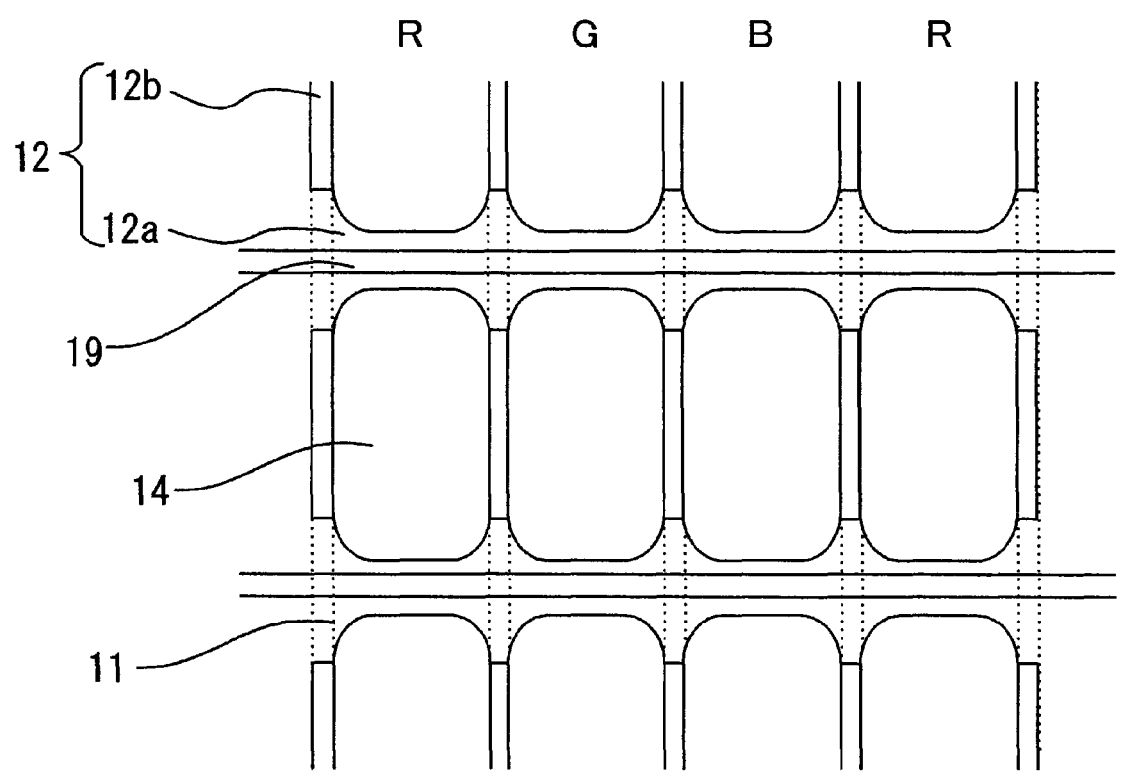
FIG. 5 is a front view schematically showing a configuration of the passive matrix (PM) driving full-color organic electroluminescent (EL) display device in accordance with Embodiment 2 of the present invention.
Figure 6:
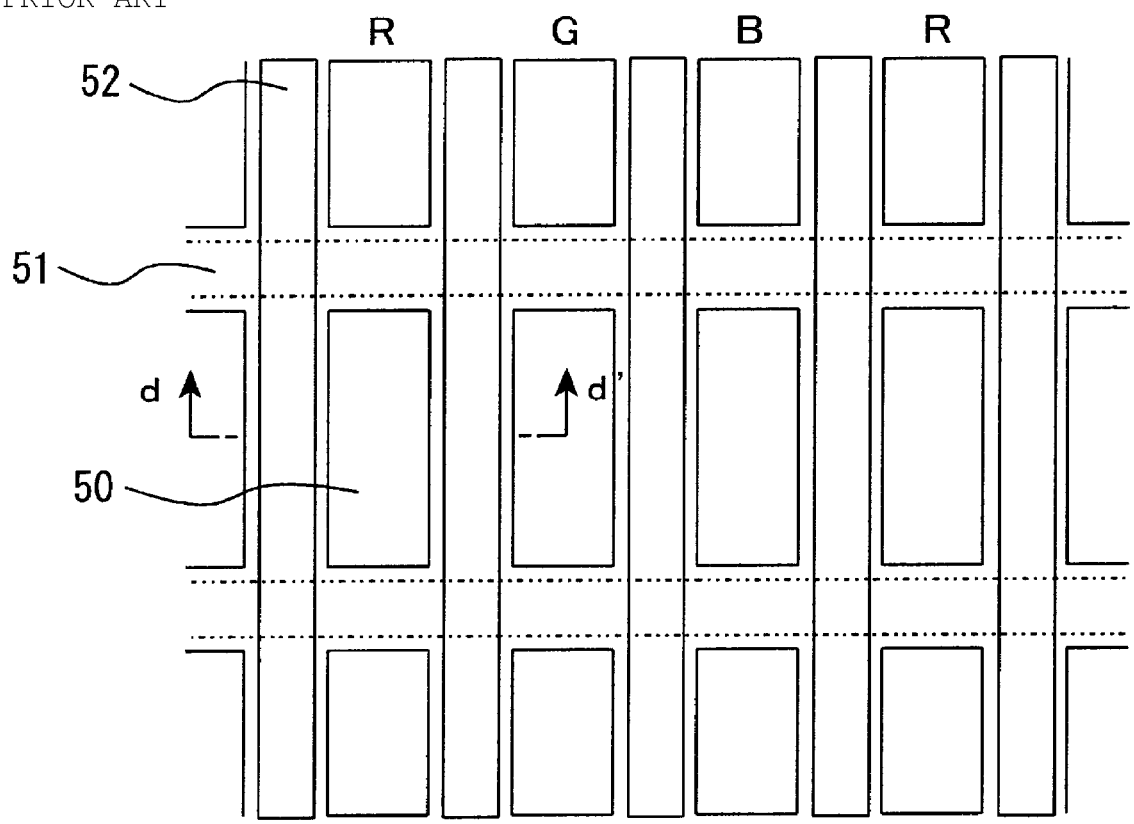
FIG. 6 is a planar view schematically showing a structure of a currently used passive matrix (PM) driving type organic EL display device.
Figure 7:
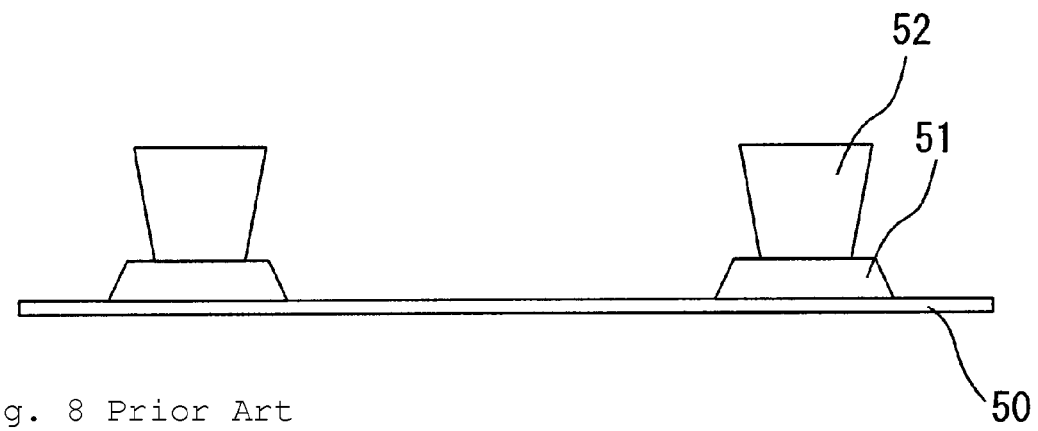
FIG. 7 is a cross-sectional view schematically showing the organic EL display device taken along line d-d' in FIG. 6.
Figure 8:
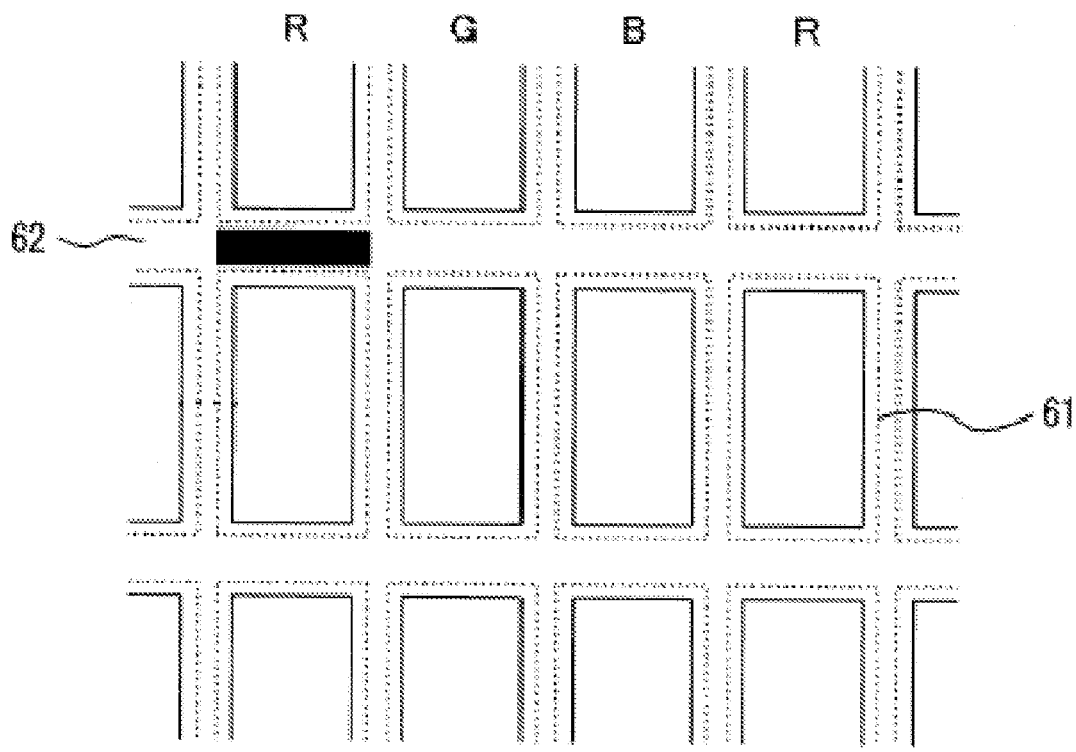
FIG. 8 is a planar view schematically showing a configuration of a conventional active matrix (AM) driving type full-color organic EL panel.

FIG. 5 is a front view schematically showing a configuration of a passive matrix (PM) driving full-color organic electroluminescent (EL) display device in accordance with Embodiment 2 of the present invention. R, G, and B in FIG. 5 represent a red pixel, a green pixel, and a blue pixel, respectively.

The organic EL display device in accordance with the present Embodiment is designed with the PM driving. The lower electrode 11 is arranged in a stripe pattern extending in the column direction (the vertical direction in FIG. 5), as shown in FIG. 5. The upper electrode (not shown) is arranged in a stripe pattern extending in the row direction (the lateral direction in FIG. 5). The pixel region 14 is surrounded by the bank 12 having two different forms (the first bank 12a and the second bank 12b).

The production process flow of the organic EL display device in accordance with the present Embodiment is mentioned below.

First, the lower electrode 11 is formed in a stripe pattern extending in the column direction. Then, the first bank 12a pattern is formed in a stripe pattern to be perpendicular to the lower electrode 11. Then, the second bank 12b pattern is formed at specific distances in a region surrounded by the lower electrode 11 and the first bank 12a. At this time, the second bank 12b is formed in such a way that the upper surface of the second bank 12b is higher than the upper surface of the first bank 12a formed on the lower electrode 11. It is preferable that the bank is set to satisfy $t2 > t1 \times 1.5$ if the film thickness of the first bank 12a is defined as t1 and the film thickness of the second bank 12b at an upper portion than the lower electrode 11 is defined as t2. It is preferable that the first bank 12a and the second bank 12b are simultaneously formed in one step in view of reduction in the production process.

Then, a cathode separator 19 pattern having a width smaller than that of the first bank 12a is formed on the first bank 12a.

Then, in the pixel region 14, organic films such as a hole transporting layer and a luminescent layer, are successively formed by an ink-jet printing method. At this time, leak defects such as color mixing can be sufficiently suppressed because the long-side side of the pixel region 14 is formed by the second bank 12b with a sufficient height. Finally, in the region between the cathode separators 19, an upper electrode (cathode) pattern is formed in a stripe pattern in the row direction. At this time, in a boundary region between the second bank 12b and the pixel region 14, the discontinuity of the upper electrode may occur. However, in the bank region having a thin film thickness between the cathode separator 19 and the second bank 12b, the conduction of the upper electrode in the lateral direction (the direction of R, G, and B are positioned in FIG. 5) can be sufficiently secured. Accordingly, the organic EL display device in accordance with the present Embodiment also can exhibit the functional effects of the present invention.

If the lower electrode 11 is not formed and the organic layer 20 is replaced by a colored layer in Embodiments 1 and 2, such Embodiments can be applied to a color filter substrate used in liquid crystal display panels and the like. In this case, a photosensitive resin monomer-containing solution into which a pigment is dispersed, and the like, may be used as an ink (coating liquid) for colored layer formation.

If a liquid crystal display panel is prepared, the color filter substrate is attached to a thin film transistor array substrate, and a liquid crystal layer is injected between the color filter substrate and the thin film transistor array substrate. Then, a voltage is applied between an upper electrode formed on the color filter substrate and a pixel electrode formed on the thin film transistor array substrate, and thereby alignment control of the liquid crystal is performed.

This Nonprovisional application claims priority (under 35 U.S.C. §119(a)) on Patent Application No. 2004-314546 filed in Japan on Oct. 28, 2004, the entire contents of which are hereby incorporated by reference

The invention claimed is:

1. An organic electroluminescent panel comprising:
   a bank including at least two bank regions including:
      a first bank region including a first film thickness; and
      a second bank region including a second film thickness that is larger than the first film thickness; and
   an organic film region surrounded by the at least two bank regions; wherein
   the first and second bank regions are arranged to intersect with each other only at a limited portion thereof such that remaining portions of the first and second bank regions do not overlap or intersect with each other; and
   only the first bank region including the first film thickness that is less than the second film thickness is present at the limited portion where the first and second bank regions intersect.

2. The organic electroluminescent panel according to claim 1,
   wherein the first bank region defines a short-side side of the organic film region having a planar shape of a rectangle or a substantial rectangle with a rounded vertex or short-side.

3. The organic electroluminescent panel according to claim 1, further comprising an upper electrode and a lower electrode, wherein
   the organic electroluminescent panel is driven by an active matrix driving system;
   the lower electrode is arranged in an island pattern including a plurality of individually partitioned dot-shaped pixel electrodes; and
   the upper electrode is arranged as a single electrode that is common to each of the plurality of individually partitioned dot-shaped pixel electrodes.

4. The organic electroluminescent panel according to claim 1,
   wherein the first bank region defines a side partitioning same colors in a pixel configuration including a plurality of colors.

5. The organic electroluminescent panel according to claim 4, further comprising an upper electrode that extends in a direction corresponding to an arrangement direction of the plurality of colors of the pixel configuration.

6. The organic electroluminescent panel according to claim 4,
   wherein the pixel configuration is a configuration in which the plurality of colors are disposed in a stripe arrangement.

7. The organic electroluminescent panel according to claim 6, wherein the first bank region extends in a direction substantially perpendicular to an extending direction of the stripe arrangement.

8. The organic electroluminescent panel according to claim 6, wherein the second bank region extends in an extending direction of the stripe arrangement.

9. The organic electroluminescent panel according to claim 1,
   wherein the bank satisfies a relationship of $t2 > t1 \times 1.5$ where the first film thickness is t1 and the second film thickness is t2.

10. The organic electroluminescent panel according to claim 1,
    wherein a region of the organic electroluminescent panel including the second film thickness includes a forward tapered cross-sectional shape.

11. An organic electroluminescent display device comprising the organic electroluminescent panel of claim 1.

12. The organic electroluminescent panel according to claim 1, wherein the second bank region includes linearly extending members that are separated from each other by the first bank region.

13. The organic electroluminescent panel according to claim 1, wherein the first bank region and the second bank region are substantially perpendicular to each other.

14. A production method of an organic electroluminescent panel comprising:
   a bank;
   the production method comprising:
      patterning by a photolitho process using different exposure amounts of a photosensitive resin-containing material to form the bank such that the bank includes:
      a first bank region including a first film thickness; and
      a second bank region including a second film thickness that is larger than the first film thickness; wherein
   the first bank and second bank regions are arranged to intersect with each other only at a limited portion thereof such that remaining portions of the first and second bank regions do not overlap or intersect with each other; and
   only the first bank region including the first film thickness that is less than the second film thickness is present at the limited portion where the first and second bank regions intersect.

15. An organic electroluminescent display device comprising an organic electroluminescent panel produced by the production method of the organic electroluminescent panel of claim 14.

16. A color filter substrate comprising:
   a bank including at least two bank regions including:
      a first bank region including a first film thickness; and
      a second bank region including a second film thickness that is larger than the first film thickness;
   a colored layer region surrounded by the at least two bank regions; wherein
   the first bank and second bank regions are arranged to intersect with each other only at a limited portion thereof such that remaining portions of the first and second bank regions do not overlap or intersect with each other; and
   only the first bank region including the first film thickness that is less than the second film thickness is present at the limited portion where the first and second bank regions intersect.

17. The color filter substrate according to claim 16, wherein the first bank region defines a short-side side of a colored layer region having a planar shape of a rectangle or a substantial rectangle with a rounded vertex or short-side.

18. The color filter substrate according to claim 16, wherein the first bank region defines a side partitioning same colors in a pixel configuration including a plurality of colors.

19. The color filter substrate according to claim 18, wherein the pixel configuration is a configuration in which the plurality of colors are disposed in a stripe arrangement.

20. The color filter substrate according to claim 16, wherein the bank satisfies a relationship of $t2 > t1 \times 1.5$ where the first film thickness is $t1$ and the second film thickness is $t2$.

21. The color filter substrate according to claim 16, wherein a region of the color filter substrate including the second film thickness includes a forward tapered cross-sectional shape.

22. A liquid crystal display panel comprising the color filter substrate of claim 16.

23. The liquid crystal display panel according to claim 22, the panel being driven by an active matrix driving system or a static driving system.

24. A liquid crystal display device comprising the liquid crystal display panel of claim 23.

25. A production method of a color filter substrate comprising:
   a bank;
   the production method comprising:
      patterning by a photolitho process using different exposure amounts of a photosensitive resin-containing material to form the bank such that the bank includes:
      a first bank region including a first film thickness; and
      a second bank region including a second film thickness that is larger than the first film thickness; wherein
   the first bank and second bank regions are arranged to intersect with each other only at a limited portion thereof such that remaining portions of the first and second bank regions do not overlap or intersect with each other; and
   only the first bank region including the first film thickness that is less than the second film thickness is present at the limited portion where the first and second bank regions intersect.

26. A liquid crystal display panel comprising a color filter substrate produced by the production method of the color filter substrate of claim 25.

27. The liquid crystal display panel according to claim 26, the panel being driven by an active matrix driving system or a static driving system.

28. A liquid crystal display device comprising the liquid crystal display panel of claim 27.

29. An organic electroluminescent panel comprising:
   at least two bank regions including a first bank region and a second bank region, the first bank region including a thickness that is less than that of the second bank region; and
   an organic film region surrounded by the at least two bank regions; wherein
   the first and second bank regions are arranged such that a cross-section taken along a length of the second bank region includes portions of the first bank region and portions of the second bank region adjacent to each other.

30. An organic electroluminescent panel comprising:
   at least two bank regions including a first bank region and a second bank region, the first bank region including a thickness that is less than that of the second bank region; and
   an organic film region surrounded by the at least two bank regions; wherein
   portions of the second bank region are separated from each other by portions of the first bank region along a length of the second bank region such that the portions of the first bank region separating the portions of the second bank region are located at intersections between the first and second bank regions.

* * * * *